United States Patent [19]

Popovic et al.

[11] Patent Number: 5,119,024
[45] Date of Patent: Jun. 2, 1992

[54] OPTICAL DEVICE FOR SENSING MAGNETIC INDUCTIONS

[75] Inventors: Radivoje Popovic, Zug; Beat Hälg, Cham; Thomas Seitz, Zug; Walter Trächslin, Walchwil, all of Switzerland

[73] Assignee: Landis & Gyr Betriebs AG, Zug, Switzerland

[21] Appl. No.: 664,865

[22] Filed: Mar. 5, 1991

[30] Foreign Application Priority Data

Mar. 9, 1990 [CH] Switzerland .............. 00773/90

[51] Int. Cl.$^5$ .............. G01R 33/02; G01B 9/02; H01J 5/16; H01J 40/14
[52] U.S. Cl. .............. 324/244.1; 324/260; 356/345; 250/227.11
[58] Field of Search .............. 324/244.1, 260, 96; 356/345; 250/227

[56] References Cited

U.S. PATENT DOCUMENTS

| | | | |
|---|---|---|---|
| 4,522,495 | 6/1985 | Shajenko | 356/345 |
| 4,533,247 | 8/1985 | Epworth | 356/345 |

FOREIGN PATENT DOCUMENTS 00134974 8/1980 European Pat. Off. .
3409207 9/1984 Fed. Rep. of Germany .

OTHER PUBLICATIONS

"Silicon as a Mechanical Material", by K. E. Petersen in Proceeding of the IEEE, vol. 70, No. 5, pp. 420–457 (1982).

*Primary Examiner*—Walter E. Snow
*Attorney, Agent, or Firm*—Marmorek, Guttman & Rubenstein

[57] ABSTRACT

A device for measuring a magnetic induction comprises an evaluation device including a source for emitting light and a receiver for receiving light. A resonator is located in the light path between the source and the receiver and comprises first and second parallel mirrors and a gaseous medium occupying the space between the two mirrors. A converter is coupled to one of the mirrors for shifting one of said mirrors along an optical axis of the resonator so that the optical length of the resonator varies in response to the induction to be measured.

10 Claims, 2 Drawing Sheets

OPTICAL DEVICE FOR SENSING MAGNETIC INDUCTIONS

BACKGROUND OF THE INVENTION

The present invention relates to a device for measuring a magnetic induction. Such devices are suitable to measure the frequency, the direction and the intensity of a magnetic field which can be produced by an electric current, for example.

BACKGROUND OF THE INVENTION

A device of the type mentioned is known from DE-OS 34 09 207 A1 and comprises a laser as a light source whose light is divided into two channels. Each channel comprises at least one Fabry-Perot resonator with a temperature-stabilized waveguide and a light receiver to measure the transparency of the resonator. The waveguide of the first resonator has an envelope made of a magnetostrictive material so that its optical length or its transparency depends on the induction prevailing at the location of the resonator. The waveguide of the optical resonator located in the second channel comprises a transparent piezo-electric material. The optical length of this resonator can be changed by means of an electric field produced by a tuning voltage applied to the waveguide. If the transparency of the two channels is equal, the tuning voltage is a measure for the induction and can be calibrated in unison with the induction.

In "Silicon as a Mechanical Material" published in the Proceedings of the IEEE, Vol. 70, No. 5, May 1982, K. E. Petersen describes the methods for the production of micromechanical elements and their properties.

The instant invention has as its object to create a simple device of the type mentioned above which can be produced economically and can be miniaturized.

SUMMARY OF THE INVENTION

In accordance with an embodiment of the present invention, a device for measuring a magnetic induction comprises an evaluation device including a source for emitting light and a receiver for receiving light. A resonator is located in the light path between the source and the receiver and comprises first and second parallel mirrors and a gaseous medium occupying the space between the two mirrors. A converter is coupled to one of the mirrors for shifting one of the mirrors along an optical axis of the resonator so that the optical length of the resonator varies in response to the induction to be measured.

DETAILED DESCRIPTION OF THE DRAWINGS

DETAILED DESCRIPTION OF THE INVENTION

Figure 1:
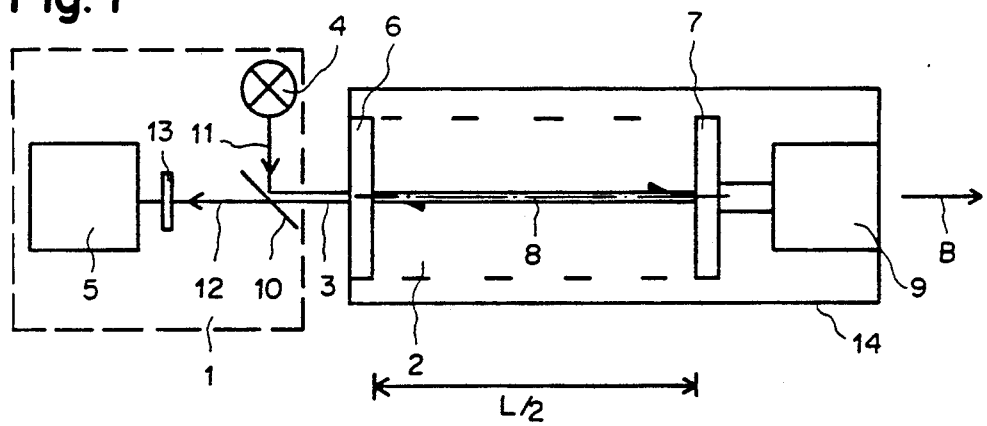
FIG. 1 illustrates a device including an optical magnetic-field sensor.

In FIG. 1 the reference 1 designates an evaluating device, the reference 2 designates an optical resonator, and the reference 3 designates an optical transmission path which connects the evaluating device 1 and the optical resonator 2. The evaluating device 1 comprises a light source 4, e.g. a source of white light, a light emitting diode or a laser and a light receiver 5 which analyses the light of light source 4 altered by the optical resonator 2 and converts the result into an electrical signal.

The optical resonator 2 comprises two parallel plane mirrors 6 and 7 facing each other at a predetermined distance and which enclose a gaseous medium between them. The optical resonator 2 is provided with an optical axis 8 which is perpendicular to both mirrors 6 and 7 simultaneously. The distance measured on the optical axis 8 between the two mirrors 6 and 7 is equal to one half the optical length L of the optical resonator 2. One or both mirrors 6, 7 can be shifted along the optical axis 8 by means of a magnetic converter 9. The converter 9 converts the active components of the induction to be measured, hereinafter induction B, into a predetermined path along the optical axis 8 and changes the optical length L in a predetermined manner. For example, the second mirror 7 is mechanically linked to the magnetic converter 9.

The converter 9 can utilize the known phenomena of magnetostriction of ferromagnetic materials, for example, or the difference between a mechanical restoring force and a force exerted by induction B upon a ferromagnet. The converter 9 produces changes of the optical length L in the range of the wavelength of the light used for read-out.

The resonator 2 functions by utilizing reflection, whereby the first mirror 6 is covered with a partially transparent coating with a reflection coefficient between 40% and 75% for perpendicular incident light. The second mirror 7 on the other hand reflects more than 90% of the incident light. Because the distance between the mirrors 6 and 7 measured on the optical axis 8 is precisely one half of the optical length L, the shift of the mirror 7 produced by the converter 9 acts with a double effect upon the optical length L.

A coupling link 10 is arranged in such manner in the evaluating device 1 that a light ray 11 is transmitted from the light source 4 into the optical transmission path 3 and to resonator 2 and an optical signal ray 12 is transmitted from the resonator 2 via transmission path 3 to the light receiver 5. The coupling link 10 can be a flat semi-transparent mirror surface for example, which is placed at a 45° angle to the light ray 11 and which guides said light ray 11 into the optical transmission path 3.

The light ray 11 is transmitted along the optical axis 8 and through the partially transparent first mirror 6 into the resonator 2 and is reflected back and forth between the two mirrors 6 and 7. A predetermined portion of the light escapes from the resonator 2 through the partially transparent first mirror 6 and reaches the light receiver 5 together with a predetermined portion of the light ray 11 reflected directly from the first partially transparent mirror 6. The two components of the signal ray 12 have a phase shift predetermined by the optical length L with respect to each other for each wavelength. Due to the interference effect, the intensity of the signal ray 12 is modulated as a function of wavelength. To ensure that the modulation resulting from interference occurs, the optical length L should be shorter than the coherence length of the light used.

If the light source 4 emits white light, a spectrometer not shown here preferably decomposes the signal ray 12 in the light receiver 5 into a spectrum. Each change in the optical length L can be measured in the spectrum as a change of the modulation of the intensity as a function of the wavelength.

If the light source 4 is of narrow band, or if a colored filter 13 is placed in the radiation path of the light ray 11 or of the signal ray 12 or in the transmission path 3, the change in the optical length L can be ascertained directly, even if less precisely than the change of intensity of the signal ray 12, by means of a simple photometer not shown here in an economical embodiment of the light receiver 5. It should preferably be possible to adjust the optical length L to the wavelength of the light used.

Since light for the transmission is not connected to any medium, the optical transmission path 3 is determined solely by the light ray 11 and the signal ray 12. However, it is advantageous to use for the optical transmission path 3 flexible, bundled light conducting fibers or other light conductors in order to avoid costly optical equipment to guide the rays 11 and 12.

The end of the light conductor of the optical transmission path 3 towards the resonator 2 is advantageously provided with a face in form of the first mirror 6 in order to avoid a large number of interfaces. The reflection coefficient of the face for perpendicular incident light can be reduced to up to 4% in case that there occurs great changes of the optical length L on the order of several wavelengths of the light, which modulate sufficiently the signal ray 12.

A closed housing 14 advantageously encloses the resonator 2 as well as the converter 9 and protects the delicate optically active coating of the mirrors 6 and 7 from dust and aggressive gases in the atmosphere. The housing 14 can be filled with a protective atmosphere, e.g. with an inert gas at a pressure from 1 Pa to 1 MPa. The housing 14 is permeable to the induction B and has at least one window for the light ray 11 and the signal ray 12. The housing 14, which contains the resonator 2 and the converter 9 forms an optical magnetic field sensor and constitutes a component that is advantageous from the point of view of assembly.

The measuring device is advantageously suited to measure the induction B caused by an electrical current wherein the optical transmission path 3 acts as a galvanic separation because the magnetic field sensor comprises only a gas-filled resonator 2, because the structural components of the magnetic field sensor can be mounted economically on the electrical potential of the current, and because electrical interference produced in the vicinity of the magnetic field sensor acts neither on the converter 9 housed in the housing 14 nor via the optical transmission path 3 on the electric signals of the light receiver 5. The length of the optical transmission path 3 can be freely chosen without influence on the measurement, and can be adapted to the existing conditions of the structural components.

Figure 2:
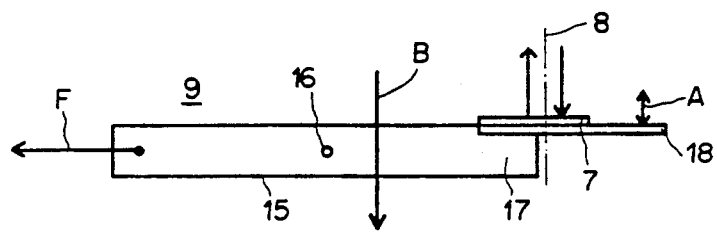
FIG. 2 illustrates a converter.

As shown in FIG. 2, the converter 9 is advantageously provided with an element 15 made of a ferromagnetic material. Element 15 is shown in the drawing as being mounted rotatably on a pivot axle 16 which is perpendicular to the plane of the drawing so as to form an oblong, two-arm lever. One arm 17 can support the second mirror 7 for example, so that said second mirror 7 can be rotated around the pivot axle 16. A predetermined restoring force F acts upon the other arm in order to bring the second mirror 7 into a predetermined position when the amount of induction B is zero.

The mechanical torque of the restoring force F and of the induction B with respect to the pivot axle 16 act upon the element 15 and rotate element 15 around the pivot axle 16 until it is in balance and the second mirror 7 shows a shift distance A in direction of the optical axis 8.

The mirror 6 (FIG. 1) or 7 capable of being shifted by induction B is advantageously connected with buffer surfaces 18 which dampen the movement of the mirrors 6 or 7 in the protective atmosphere in order to avoid building up oscillations of mirrors 6 or 7. The extent of damping is predetermined by the pressure of the protective atmosphere and the size of the buffer surfaces 18.

Figure 3:
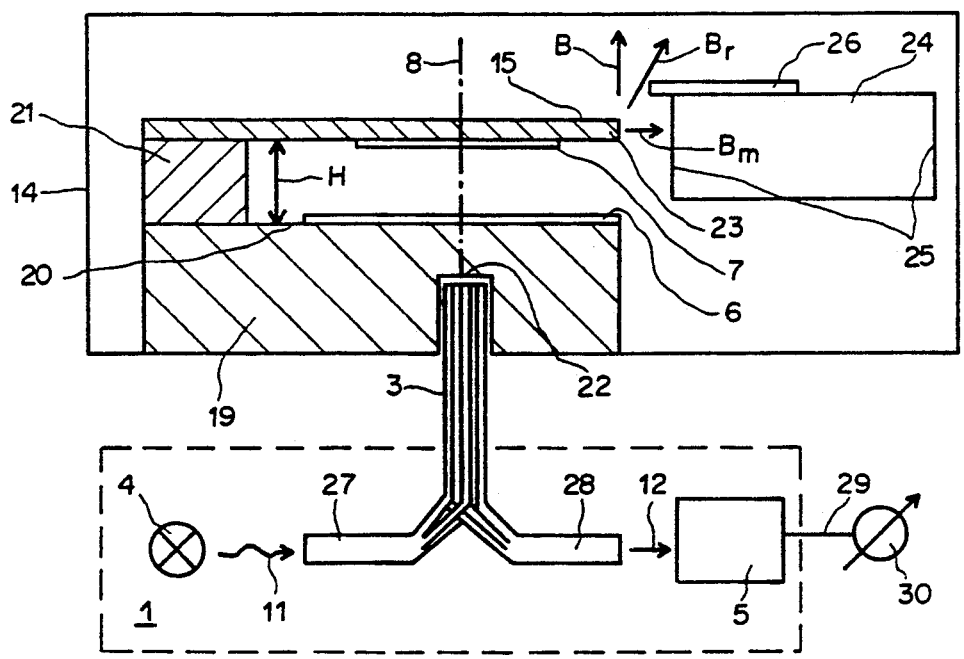
FIG. 3 illustrates a measuring device with a single mirror capable of being moved out of its position.

In FIG. 3 element 15 is made advantageously in form of a one-arm lever clamped on one side which is characterized by low inertia. An even substrate 19 of predetermined thickness and transparent to the light is provided in the housing 14. A portion of a surface 20 of substrate 19 is made in form of a partially transparent fixed first mirror 6. Below mirror 6 the side of substrate 19 away from surface 20 is provided with a cylindrical recess 22, the axis of which coincides with the optical axis 8 and serves to couple or uncouple the rays 11 or 12.

At a predetermined distance outside the first mirror 6 a spacer 21 of predetermined height H is provided on the surface 20 to serve as support for the thin, sheet-shaped ferromagnetic element 15, the surface of which is parallel in its rest position at height H, to the surface 20. Element 15 is firmly connected to the spacer 21 and extends freely beyond spacer 21 on one side, whereby element 15 covers the first mirror 6 with its free end 23. Under the influence of induction B the free end 23 can be moved along the optical axis 8 and swings back in the manner of a spring into its rest position due to the restoring force F exerted on the element 15.

Opposite the first mirror 6, the surface of element 15 is made in form of a second mirror 7 so that the resonator 2 (FIG. 1) has an optical length L (FIG. 1) that is twice the height H. As soon as the amount of induction B is other than zero the element 15 is subjected to a force in the direction of induction B and moves a shift distance A (FIG. 2) from its rest position in direction of the optical axis 8.

The element 15 is advantageously placed with its free end 23 in the field of a magnet 24 with the two pole surfaces 25 so that the shift distance A is essentially dependent on induction B in a linear manner. For example, a permanent magnet 24 is attached on substrate 19 opposite the free end 23. The induction Bm takes effect between the free end 23 and at least one pole surface 25. Magnet 24 is placed in relation to element 15 in such manner that element 15 is in its predetermined rest position under the effect of induction Bm. Element 15 always points with its free end 23 in direction of the induction Br resulting from the two inductions B and Bm. The shift distance A is linearly dependent on B because Bm >> B. Element 15 of FIG. 3 is more sensitive than the element 15 of FIG. 2 because the full restoring force F (FIG. 2) is no longer required and the element 15 of FIG. 3 has less inertia.

The magnet 24 may also be U-shaped, with element 15 being placed between the two pole surfaces 25.

The magnet 24 is preferably outfitted for the alteration of the direction and of the amount of induction Bm, e.g. by means of a predetermined adjustable magnetic element 26 in order to adjust the resonator 2 to a predetermined value of induction B, e.g. to the value zero.

An optical fiber bundle or other light conductor bundle used as the transmission path 3 is inserted at one end in the recess 22 of the substrate 19 and provides a good optical connection with the substrate 19 so that light is able to travel from the light conductor bundle to the resonator 2 or in the opposite direction without interfering reflections. A short distance before the evaluating device 1, the optical fibers of the light conductor bundle divide into two branches 27 and 28 in such a manner that the fibers of the two branches 27 and 28 are evenly distributed over the entire cross-section of the bundle. The first branch 27 receives light ray 11 from light source 4 and the second branch 28 guides the signal ray 12 to the light receiver 5. The advantage of this arrangement is that the optical coupling link 10 (see FIG. 1) is omitted and a precise alignment of the light source 4 and the light receiver 5 with the optical transmission path 3 is not required.

Illustratively, the light receiver 5 may be connected by means of a circuit 29 to a display device 30 for the electrical signal. The amount of the induction B at the site of the converter 9 (FIG. 1) can be read using appropriate units.

Substrate 19 may be glass for example, or a semiconductor such as single-crystal silicon. These materials make it possible to produce the magnetic field sensor economically in very small dimensions by means of a known micro-technical process. Such magnetic field sensors not only distinguish themselves through their insensitivity to mechanical shock but also have good frequency response up into the 10-kHz range to register rapid changes in Induction B.

The cantilevered element 15 may have a length of 1.5 mm for example, a width of 1 mm and a thickness of 1 μm. Nickel or the alloy PERMALLOY ® may be used as the ferromagnetic material. The height H of the spacer 21 which determines the optical length L measures typically a few micrometers up to several tens of micrometers when white light is used. The fibers of the light conductor bundle of the transmission path 3 have a diameter of approximately 50 μm.

Figure 4:
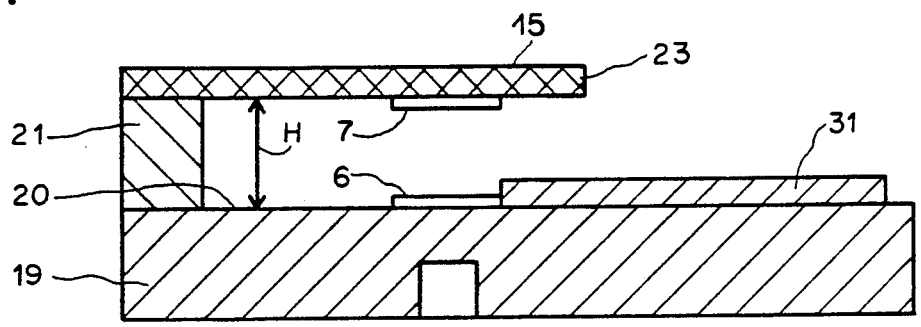
FIG. 4 illustrates a magnetic sensor with one mirror capable of being shifted.

In FIG. 4, the magnetic field sensor is advantageously provided with an additional ferromagnetic element 31 on the surface 20 of substrate 19 in order to increase the magnetic field sensor's sensitivity to direction. The element 31 is placed directly next to the first mirror 6 on surface 20, with the free end 23 of element 15 overlapping part of the element 31. Element 15 and element 31 are preferably parallel to a common straight line. Their distance is predetermined by the height H of the spacer 21. Element 15 supports the second mirror 7 which, together with the first mirror 6 facing it, constitutes the resonator 2 (FIG. 1).

Figure 5:
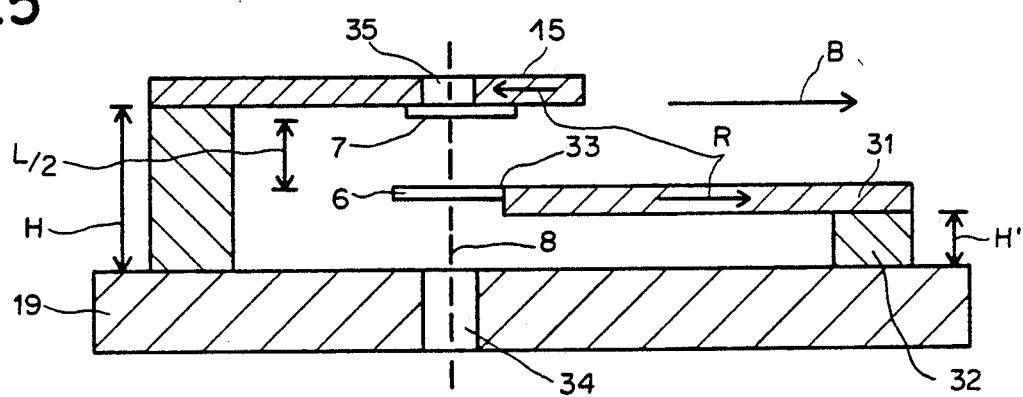
FIG. 5 illustrates a magnetic field sensor with two mirrors capable of being shifted.

According to FIG. 5, the element 31 may also be placed at a predetermined distance H' above substrate 19 by means of a support 32. The element 31 extends beyond the support 32 so that its cantilevered end portion 33 can be moved under the effect of induction B. The end portion 33 supports the partially transparent first mirror 6 and element 15 supports the second mirror 7. The two mirrors 6 and 7 are parallel to each other, facing each other and are movable. The optical length L is double the difference between heights H and H'. The element 15 and the element 31 advantageously have residual inductions R opposed to each other in order to expand the measuring range of the magnetic field sensor.

The element 31 which is attached on one side to the support 32 has preferably the same properties as element 15 so that an additional bending of the element 15 due to external mechanical acceleration is compensated through an equal bending of the element 31 so that the optical length L does not change.

The optical transmission path 3 (FIG. 1) goes through a bore 34 centered in the substrate 19 on the optical axis 8 to resonator 2 (FIG. 1).

Element 15 and the additional element 31 may also be placed parallel and above each other at predetermined distances on the same support.

If both the mirrors 6 and 7 are partially transparent and if the resonator 2 is placed between the light source 4 (FIG. 1) and the light receiver 5 (FIG. 1), the optical length L is precisely three times the distance between mirrors 6 and 7. The resonator 2 changes its transparency according to the optical length L changed by the induction B. Light ray 11 (FIG. 1) goes through the first mirror 6 and enters resonator 2. Part of the light ray 11 penetrates the resonator 2 without reflection and leaves the resonator 2 through the second mirror 7 together with the other part of light ray 11 which is reflected at least once from each of the two mirrors 6 and 7. This light goes through a hole 35 provided on the optical axis 8 in element 15 and forms the modulated signal ray 12 which depends on the optical length L (see FIG. 1).

Figure 6:
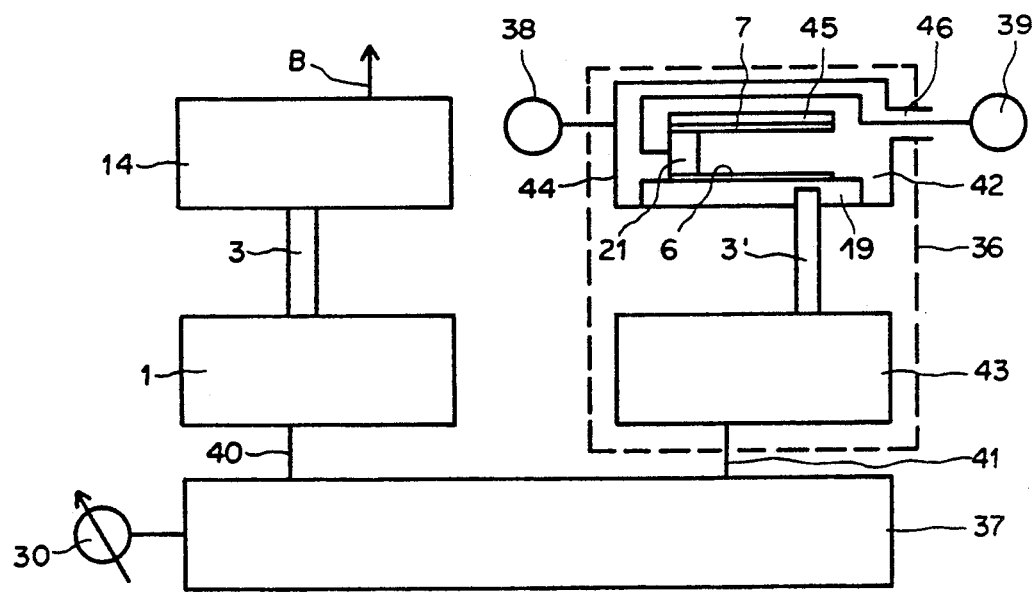
FIG. 6 illustrates an application of the measuring device.

FIG. 6 shows an advantageous combination of the magnetic field sensor described above with a voltage measuring device 36 and evaluation electronics 37 suitable to measure electrical power or electrical energy. No galvanic separation going to a current-carrying conductor 38 is necessary for the magnetic field sensor installed in housing 14 because the optical transmission path 3 effects the galvanic separation connecting the magnetic field sensor to the evaluating device 1. The direction of the electric current in conductor 38 is assumed to go into the plane of the drawing in accordance with induction B. The voltage measuring device 36 is located between the conductor 38 and a conductor 39 which is at a reference potential.

The evaluating electronics 37 are connected to the evaluating device 1 by means of an electric path 40 for a signal representative of the current and to the voltage measuring device by means of a circuit 41 for a signal representative of a voltage. The evaluating electronics 37 convert the current and voltage signals into power and energy magnitudes and display these on the display device 30.

The voltage measuring device 36 preferably comprises an electric field sensor 42 and an evaluating device 43 which are connected to each other by means of the second transmission circuit 3'.

The electric field sensor 42 may be constructed mechanically in the identical manner as the magnetic field sensor for example, with the exception that is screening housing 44 does not contain any magnetic materials. Instead of element 15 (FIG. 3) a bending element 45 of identical dimensions made of highly elastic silicon dioxide is installed on the spacer 21 to serve as a sensor for an electric field.

The electrically conductive coatings of the mirrors 6 and 7 can be electrically connected to each other via the spacer 21 for example and are connected to conductor 39 via an insulated passage 46 of the screening housing 44. Substrate 19 insulates mirror 6 from the screening housing 44 which is kept at the voltage of the conductor 38 so that housing 14 and the screening housing 44 have the same voltage and can therefore be easily connected mechanically. As in a leaf electrometer, the optical length L (FIG. 1) changes under the effect of an electrical repelling force prevailing between the mirrors 6 and 7.

In a different embodiment, an optical resonator which is not shown here is used together with a wave guide made of a piezoelectric material to serve as field sensor 42. The optical length L is changed by the voltage difference applied to electrodes between conductors 38 and 39.

If the evaluating electronics 37 are at the reference voltage of the conductor 39, the voltage signal of conductor 41 may also be compensated by a voltage divider or transformer which is not shown here and which is located between the conductors 38 and 39.

The evaluating device 1 is preferably used to interrogate both sensors in the housings 14 and 44 in order to obtain a signal pair consisting of the current signal and the voltage signal in a simple manner, whereby said evaluating device 1 alternating interrogates one of the two sensors optically and produces the respective electrical signal. The evaluation electronics 37 store the measured values of a signal pair before calculation of a power or an energy quantum.

Finally, the above-described embodiments of the invention are intended to be illustrative only. Numerous alternative embodiments may be devised by those skilled in the art without departing from the spirit and scope of the following claims.

We claim:

1. A device for measuring a magnetic induction comprising
    an evaluation device comprising a light source for emitting light and a light receiver in communication with the light source via a light path, and a resonator located in the light path between the source and the receiver, said resonator comprising first and second parallel mirrors and a gaseous medium occupying the space between said mirrors.
    a converter coupled to one of said mirrors for shifting one of said mirrors along an optical axis of said resonator so that an optical length of said resonator varies in response to the magnetic induction to be measured.
    wherein the converter comprises a ferromagnetic element, wherein said ferromagnetic element is fixedly attached at one end to a spacer located on a substrate, wherein the other free end of the ferromagnetic element is connected to the second mirror, and wherein the first mirror is partly transparent and is fixedly mounted on said substrate.
    wherein said free end of the ferromagnetic element is located int he field of a magnet and wherein the induction produced by said magnet is greater than the induction to be measured.

2. A device for measuring a magnetic induction comprising
    an evaluation device comprising a light source for emitting light and a light receiver in communication with the light source via a light path, and a resonator located in the light path between the source and the receiver, said resonator comprising first and second parallel mirrors and a gaseous medium occupying the space between said mirrors,
    a converter coupled to one of said mirrors for shifting one of said mirrors along an optical axis of said resonator so that an optical length of said resonator varies in response to the magnetic induction to be measured,
    wherein said converter comprises a first ferromagnetic element ad a second ferromagnetic element, where one end of the first ferromagnetic element is attached fixedly to a spacer located on a substrate and a second free end of said first ferromagnetic element is connected to the second mirror, wherein the first mirror is partially transparent and is installed on a free end portion of the second ferromagnetic element which is attached at the other end to a support, and wherein both mirrors are capable of being shifted in a predetermined manner.

3. Device as in claim 2 wherein the first ferromagnetic element and the second ferromagnetic element are permanent magnets which have residual inductions opposed to each other.

4. Device as in claim 1, wherein said mirror which can be shifted is provided with damping surfaces.

5. Device as in claim 1, wherein the resonator and the converter are enclosed in a housing.

6. Device as in claim 1, wherein light conductors are provided to serve as a transmission path between the resonator and the light source and between the resonator and the light receiver and wherein the face of the light conductors of the transmission path towards the resonator are formed by the first mirror of the resonator.

7. A device for measuring a magnetic induction comprising
    an evaluation device comprising a light source for emitting light and a light receiver in communication with the light source via a light path, and a resonator located in the light path between the source and the receiver, said resonator comprising first and second parallel mirrors and a gaseous medium occupying the space between said mirrors,
    a converter coupled to one of said mirrors for shifting one of said mirrors along an optical axis of said resonator so that an optical length of said resonator varies in response to the magnetic induction to be measured,
    wherein said device further comprises, in order to measure electrical power or energy magnitudes, an electrostatic voltage measuring device and evaluating electronics, wherein the induction of a conductor through which current flows can be measured by means of the device for measuring a magnetic induction and the voltage of the conductor can be measured against a reference voltage of an additional conductor by means of the voltage measuring device and wherein the devaluating electronics comprises means for evaluating a current signal of said induction measuring device and a voltage signal of the voltage measuring device.

8. Device as in claim 2, wherein said mirror which can be shifted is provided with damping surfaces.

9. Device as in claim 2 wherein the resonator and the converter are enclosed in a housing.

10. Device as in claim 2, wherein light conductors are provided to serve as a transmission path between the resonator and the light source and between the resonator and the light receiver and wherein the face of the light conductors of the transmission path towards the resonator are formed by the first mirror of the resonator.

* * * * *